(12) United States Patent
Okuno et al.

(10) Patent No.: US 6,773,979 B2
(45) Date of Patent: Aug. 10, 2004

(54) METHOD FOR FABRICATING SEMICONDUCTOR DEVICE

(75) Inventors: Yasutoshi Okuno, Soraku-gun (JP); Akihiko Tsuzumitani, Ibaraki (JP); Yoshihiro Mori, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/032,564

(22) Filed: Jan. 2, 2002

(65) Prior Publication Data

US 2002/0106816 A1 Aug. 8, 2002

(30) Foreign Application Priority Data

Feb. 6, 2001 (JP) ........................................ 2001-030068

(51) Int. Cl.[7] .......................................... H01L 21/8242
(52) U.S. Cl. ...................... 438/239; 438/253; 438/396; 438/652
(58) Field of Search ............................ 438/3, 240, 244, 438/253, 387, 396, FOR 220, FOR 430, 239, 652, 656; 204/192.17

(56) References Cited

U.S. PATENT DOCUMENTS

| | | | |
|---|---|---|---|
| 5,534,458 A | * 7/1996 | Okudaira et al. | 438/240 |
| 5,571,746 A | * 11/1996 | Pan | 438/396 |
| 5,581,436 A | * 12/1996 | Summerfelt et al. | 361/321.1 |
| 5,783,719 A | 7/1998 | Sun et al. | |
| 5,929,267 A | 7/1999 | Kadokura | |
| 6,146,941 A | * 11/2000 | Huang et al. | |
| 6,162,712 A | 12/2000 | Baum et al. | |
| 6,168,991 B1 | * 1/2001 | Choi et al. | |
| 6,239,010 B1 | * 5/2001 | Lu | |
| 6,255,187 B1 | * 7/2001 | Horii | |
| 6,300,216 B1 | * 10/2001 | Shan | |
| 6,303,429 B1 | * 10/2001 | Ishibashi et al. | |
| 6,534,809 B2 | * 3/2003 | Moise et al. | 257/295 |

FOREIGN PATENT DOCUMENTS

| | | |
|---|---|---|
| JP | 10-209399 A | 8/1998 |
| JP | 11-292889 | 10/1999 |
| JP | 2000-357783 A | 12/2000 |
| JP | 2001-135799 A | 5/2001 |
| JP | 2001-144270 A | 5/2001 |

* cited by examiner

*Primary Examiner*—George Fourson
*Assistant Examiner*—Michelle Estrada
(74) *Attorney, Agent, or Firm*—Nixon Peabody LLP; Donald R. Studebaker

(57) ABSTRACT

The invention provides a method for fabricating a semiconductor device including a concaved capacitor device having a lower electrode, a capacitor dielectric film of a perovskite type high dielectric constant or ferroelectric material formed on the lower electrode and an upper electrode formed on the capacitor dielectric film. In this method, a step of forming a conducting film to be formed into the lower electrode includes sub-steps of forming a lower conducting film by sputtering on walls and a bottom of a recess formed in an insulating film on a substrate; and forming an upper conducting film on the lower conducting film by CVD.

12 Claims, 7 Drawing Sheets

METHOD FOR FABRICATING SEMICONDUCTOR DEVICE

BACKGROUND OF THE INVENTION

The present invention relates to a method for fabricating a semiconductor device, and more particularly, it relates to a method for forming a conducting film serving as a lower electrode or an upper electrode of a semiconductor device including a capacitor dielectric film made from a perovskite type high dielectric constant or ferroelectric material.

A conducting film serving as a lower electrode or an upper electrode of a semiconductor device including a capacitor dielectric film made from a perovskite type high dielectric constant or ferroelectric material is made from a noble metal film having an oxidation-resistant property such as a platinum film, and the noble metal film is formed by sputtering.

In accordance with improvement in the refinement and the degree of integration of semiconductor integrated circuits, a DRAM cell included in a semiconductor integrated circuit is desired to be finer, and a capacitor device included in a DRAM cell is formed three-dimensionally. Thus, a concaved capacitor device has been proposed.

A method for fabricating a conventional semiconductor device including a concaved capacitor device will now be described with reference to FIG. 7A.

First, after forming an insulating film 2 of a silicon oxide film having a recess on a semiconductor substrate 1, a lower electrode 3 of a first platinum film is formed by sputtering on the walls and the bottom of the recess of the insulating film 2.

Next, after forming a capacitor dielectric film 4 of a perovskite type high dielectric constant material such as a BST (barium strontium titanium oxide) film on the lower electrode 3, an upper electrode 5 of a second platinum film is formed by the sputtering on the capacitor dielectric film 4.

Since a capacitor device is desired to be finer in accordance with demands for further refinement of a DRAM cell, the average plane size of the recess of the insulating film 2 where the lower electrode 3 is formed has been reduced to, for example, a shorter side of approximately 0.15 µm and a longer side of approximately 0.3 µm.

Since the aspect ratio of the recess of the insulating film 2 in this size is higher than a conventional one, the coverage is so low that the thicknesses of the lower electrode 3 and the upper electrode 5, namely, the platinum films formed by the sputtering, are reduced at the bottom corners, and in addition, an overhang is formed at the upper portion of the upper electrode 5.

When the thickness of the lower electrode 3 is small at the bottom corners, the platinum film used for forming the lower electrode is agglomerated, namely, platinum included in a portion with a small thickness moves to a portion with a large thickness, during annealing for forming the capacitor dielectric film 4 by CVD (chemical vapor deposition). As a result, the lower electrode 3 is disadvantageously disconnected at the bottom corners as shown in FIG. 7B.

When the thickness of the upper electrode 5 is small at the bottom corners, the platinum film used for forming the upper electrode 5 is agglomerated during annealing for improving the quality of the capacitor dielectric film 4. As a result, the upper electrode 5 is disadvantageously disconnected at the bottom corners as shown in FIG. 7B. Also, when an overhang is formed at the upper portion of the upper electrode 5, an empty space is disadvantageously formed in the upper electrode 5.

Accordingly, as disclosed in, for example, U.S. Pat. Nos. 6,162,712, 5,783,719, 5,929,267 and Japanese Laid-Open Patent Publication No. 11-292889, the platinum films used as the lower electrode 3 and the upper electrode 5 are formed by the CVD for attaining good coverage.

When the CVD is employed for forming the platinum film serving as the lower electrode 3, however, the platinum film is formed by the CVD on the insulating film 2 of a silicon oxide film, which degrades the morphology of the platinum film, namely, which results in forming micro irregularities on the surface of the platinum film. This leads to a problem of degradation in the quality of the capacitor dielectric film 4 formed on the platinum film.

Also, when the platinum film serving as the upper electrode 5 is formed by the CVD, the CVD is carried out on the capacitor dielectric film 4 of a BST film. Therefore, an organic substance such as carbon generated from the BST film and a material gas is caught in the platinum film, resulting in degrading the electric characteristic on the interface between the capacitor dielectric film 4 and the upper electrode 5.

SUMMARY OF THE INVENTION

In consideration of the aforementioned conventional problems, a first object of the invention is preventing a conducting film that is formed on the walls and the bottom of a recess of an insulating film to be used as a lower electrode from being disconnected at bottom corners as well as improving the quality of a capacitor dielectric film formed on the conducting film, and a second object is preventing a conducting film that is formed in a small recess to be used as an upper electrode from being disconnected at bottom corners and from having an overhang at an upper portion thereof as well as improving the electric characteristic on the interface between the capacitor dielectric film and the upper electrode.

In order to achieve the first object, the first method of this invention for fabricating a semiconductor device including a concaved capacitor device having a lower electrode, a capacitor dielectric film of a perovskite type high dielectric constant or ferroelectric material formed on the lower electrode and an upper electrode formed on the capacitor dielectric film, comprises a step of forming a conducting film to be formed into the lower electrode including sub-steps of depositing a lower conducting film by sputtering on walls and a bottom of a recess formed in an insulating film on a substrate; and depositing an upper conducting film on the lower conducting film by CVD.

In the first method for fabricating a semiconductor device, since the lower conducting film included in the conducting film to be formed into the lower electrode is formed by the sputtering, the conducting film to be formed into the lower electrode is improved in its morphology, which improves the quality of the capacitor dielectric film formed on the conducting film. Also, since the upper conducting film disposed on the lower conducting film is formed by the CVD, the conducting film to be formed into the lower electrode attains a uniform thickness. Therefore, although the lower electrode is formed in a small recess, the conducting film to be formed into the lower electrode is minimally agglomerated during annealing for forming a perovskite type high dielectric constant or ferroelectric material film to be used as the capacitor dielectric film. As a result, the lower electrode can be prevented from being disconnected at bottom corners.

In the first method for fabricating a semiconductor device, the lower conducting film preferably has a thickness of 0.5 nm through 5 nm.

Thus, the thickness of the lower conducting film can be made uniform, and hence, the upper conducting film can be stably formed on the lower conducting film by the CVD. Therefore, not only the conducting film to be formed into the lower electrode can attain a uniform thickness but also the lower electrode can be definitely prevented from being disconnected at bottom corners.

In order to achieve the second object, the second method of this invention for fabricating a semiconductor device including a capacitor device having a lower electrode, a capacitor dielectric film of a perovskite type high dielectric constant or ferroelectric material formed on the lower electrode and an upper electrode formed on the capacitor dielectric film, comprises a step of forming a conducting film to be formed into the upper electrode including sub-steps of depositing a lower conducting film by sputtering; and depositing an upper conducting film on the lower conducting film by CVD.

In the second method for fabricating a semiconductor device, since the lower conducting film included in the conducting film to be formed into the upper electrode is formed by the sputtering, an organic substance such as carbon generated from the perovskite type high dielectric constant or ferroelectric film and a material gas can be prevented from being caught in the lower conducting film. Therefore, the degradation in the electric characteristic on the interface between the capacitor dielectric film and the upper electrode can be avoided. Also, since the upper conducting film disposed on the lower conducting film is formed by the CVD, the conducting film to be formed into the upper electrode can attain a uniform thickness. Therefore, the conducting film to be formed into the upper electrode is minimally agglomerated during annealing for improving the electric characteristic of the perovskite type high dielectric constant or ferroelectric film, and hence, the upper electrode can be prevented from being disconnected at bottom corners. Furthermore, the conducting film to be formed into the upper electrode can be prevented from having an overhang.

In the second method for fabricating a semiconductor device, the capacitor device may be a concaved capacitor device or a stacked capacitor device.

In the second method for fabricating a semiconductor device, the CVD is preferably carried out in an oxidizing atmosphere.

Thus, the degradation of the perovskite type high dielectric constant or ferroelectric film used as the capacitor dielectric film can be avoided, and the self-catalytic effect can be suppressed so as to form the upper conducting film in a uniform thickness.

In the second method for fabricating a semiconductor device, the lower conducting film preferably has a thickness of 0.5 nm through 5 nm.

Thus, the lower conducting film can attain a uniform thickness, and hence, the upper conducting film can be stably formed on the lower conducting film by the CVD. Therefore, not only the conducting film to be formed into the upper electrode can attain a uniform thickness but also the disconnection of the upper electrode at the bottom corners and the formation of an overhang at the upper portion of the upper electrode can be definitely avoided.

DETAILED DESCRIPTION OF THE INVENTION

Embodiment 1

A method for fabricating a semiconductor device including a concaved capacitor device will now be described as Embodiment 1 of the invention with reference to FIGS. 1A through 1C, 2A through 2C, 3A through 3C, 4A and 4B.

Figure 1A:
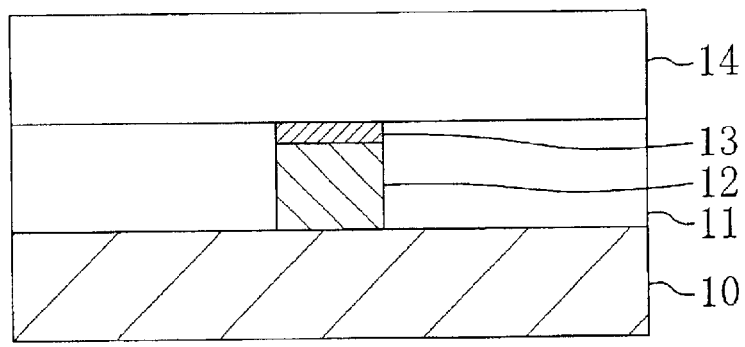
FIGS. 1A, 1B and 1C are cross-sectional views for showing procedures in a method for fabricating a semiconductor device according to Embodiment 1 of the invention.

First, as shown in FIG. 1A, after forming a first interlayer insulating film 11 of a silicon oxide film on a semiconductor substrate 10 by, for example, CVD, a plug 12 and a barrier layer 13 are buried in the first interlayer insulating film 11. The plug 12 is made from, for example, tungsten or polysilicon, and the barrier layer 13 is made from a material having an oxidation-resistant property and small electric resistance, such as TiAlN, for preventing oxidation of the plug 12. Thereafter, a second interlayer insulating film 14 of a silicon oxide film is formed on the first interlayer insulating film 11 including the plug 12 and the barrier layer 13 by, for example, the CVD.

Figure 1B:
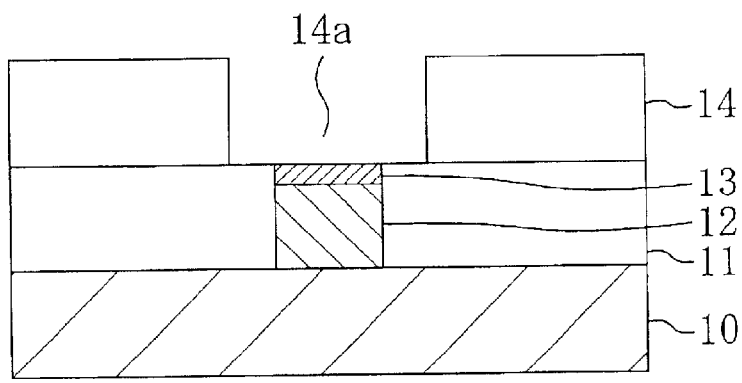

Next, as shown in FIG. 1B, the second interlayer insulating film 14 is selectively dry etched, so as to form a recess 14a in the second interlayer insulating film 14 for exposing the barrier layer 13.

Figure 1C:
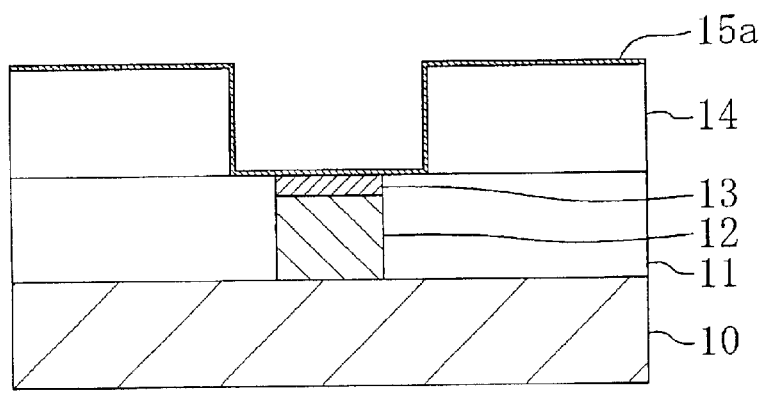

Then, as shown in FIG. 1C, a first lower platinum film 15a is formed by sputtering on the second interlayer insulating film 14 and the walls and the bottom of the recess 14a in a thickness of, for example, approximately 0.5 through 5 nm. Although not shown in the drawing, an adhesion layer of, for example, a titanium film may be formed between the second interlayer insulating film 14 and the first lower platinum film 15a by the sputtering.

Figure 2A:
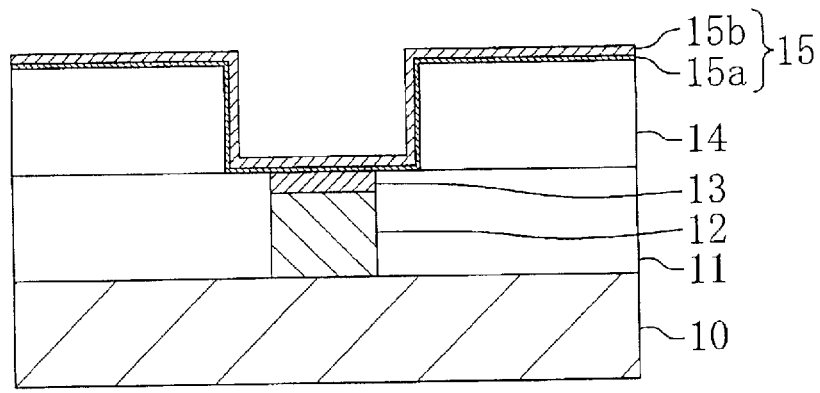
FIGS. 2A, 2B and 2C are cross-sectional views for showing other procedures in the method for fabricating a semiconductor device of Embodiment 1.

Subsequently, as shown in FIG. 2A, a first upper platinum film 15b is formed on the first lower platinum film 15a in a thickness of, for example, approximately 10 through 20 nm by the CVD carried out in an oxidizing gas atmosphere. Thus, a first platinum film 15 is formed from a multi-layer film composed of the first lower platinum film 15a and the first upper platinum film 15b. The first upper platinum film 15b is formed under the following conditions:

Precursor: dimethylplatinum cyclooctadiene (($CH_3$)$_2$PtC$_8$H$_{12}$)

Temperature: 350° C.

Method: vaporized solution source MOCVD (LD-MOCVD)

Solvent: tetrahydrafuran oxidizing gas: oxygen gas (flow rate: 50 through 10 ml/min. (normal condition))

Carrier gas: argon gas (flow rate: approximately 200 ml/min. (normal condition))

Pressure in chamber: 133 Pa through 266 Pa

Temperature in carburetor: approximately 100° C.

The precursor may be $(CH_3C_5H_4)(CH_3)_3Pt$ or $(C_5H_5)(CH_3)_3Pt$.

Also, the temperature is preferably 350° C. or less. When the temperature is higher than 350° C., the mechanism in film formation is shifted from the supply controlling step to the reaction controlling step, so that a film with good coverage cannot be formed. In addition, the surface of the TiAlN layer serving as the barrier layer 13 is oxidized so as to form an insulating oxide film on the interface between the barrier layer 13 and the first platinum film 15, which increases plug resistance.

Since the first upper platinum film 15b is formed in an oxidizing gas atmosphere, the self-catalytic effect can be suppressed as compared with the case where it is formed in a reducing atmosphere. The self-catalytic effect is an effect in which a platinum organic metal included in the material gas is decomposed so that the surface of the platinum film can work as a catalyst for decomposing the platinum organic metal on the surface of the platinum film where platinum is deposited. When the self-catalytic effect occurs, the deposition rate on the surface of the platinum film becomes higher than the deposition rate on the surface of another film different from the platinum film, so that platinum can be preferentially deposited on a portion covered with platinum.

However, since the first upper platinum film 15b is formed in an oxidizing gas atmosphere, the self-catalytic effect can be suppressed sufficiently for controlling the CVD process. Accordingly, the first upper platinum film 15b can be formed in a uniform thickness. In this case, the flow rate of the oxygen gas is preferably set to such a value that the barrier layer 13 can be prevented from being oxidized in the oxidizing gas atmosphere.

Figure 2B:
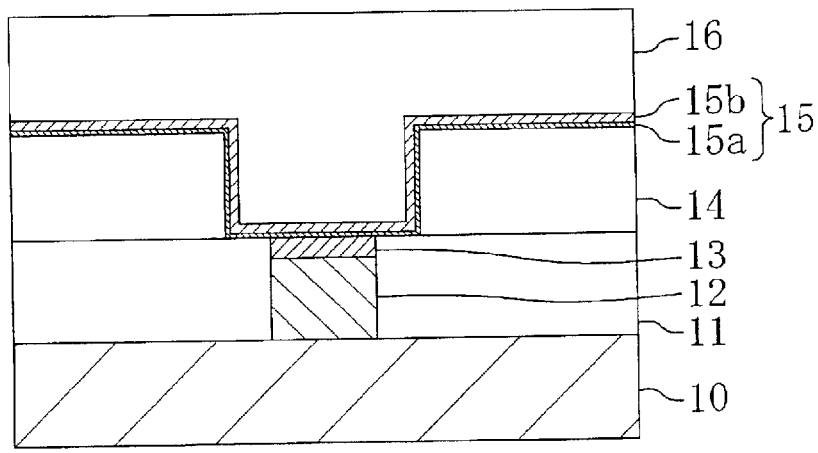

Next, as shown in FIG. 2B, for example, a silicon oxide film 16 is deposited on the first platinum film 15 so as to fill the recess of the first platinum film 15. The silicon oxide film 16 may be replaced with a resist film, an organic coat film or the like.

Figure 2C:
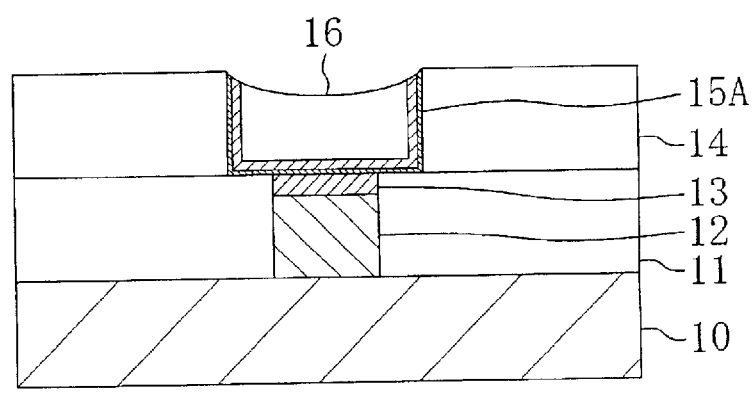

Then, a portion of the silicon oxide film 16 deposited on the first platinum film 15 is removed by etch back or CMP so as to expose the first platinum film 15. Thereafter, the exposed portion of the first platinum film 15 is etched back by using a mixed gas of an argon gas, a chlorine gas and an oxygen gas as an etching gas until the second interlayer insulating film 14 is exposed. Thus, a lower electrode 15A having a recess is formed from the first platinum film 15 as shown in FIG. 2C.

Figure 3A:
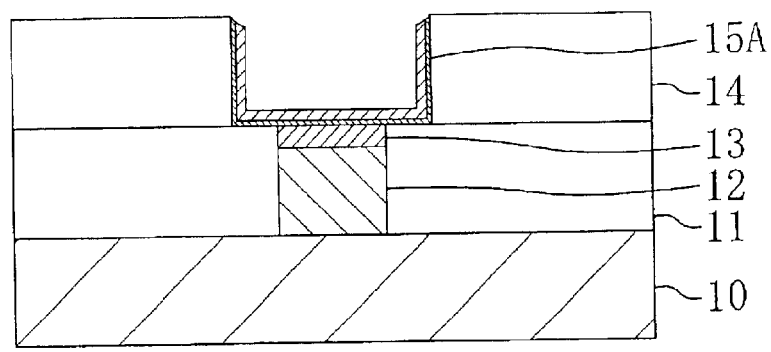
FIGS. 3A, 3B and 3C are cross-sectional views for showing still other procedures in the method for fabricating a semiconductor device of Embodiment 1.

Next, as shown in FIG. 3A, the silicon oxide film 16 remaining in the recess of the lower electrode 15A is removed by ashing using oxygen plasma.

Figure 3B:
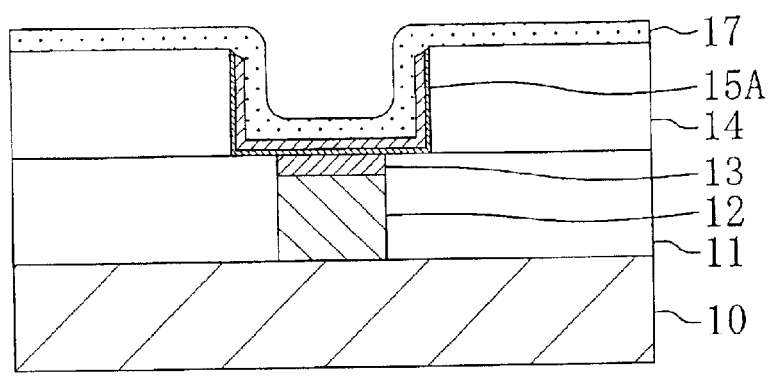

Then, as shown in FIG. 3B, a perovskite type high dielectric constant or ferroelectric film such as a BST film 17 is deposited on the walls and the bottom of the recess of the lower electrode 15A and over the second interlayer insulating film 14 by the CVD. In this manner, the BST film 17 having a recess is formed on the lower electrode 15A. The BST film 17 is formed under the following conditions:

Precursor: $Ba(C_{11}H_{19}O_2)_2$, $Sr(C_{11}H_{19}O_2)_2$ and $Ti(C_{11}H_{19}O_2)_2(C_3H_7O)_2$ Temperature: 450 through 550° C.

Method: vaporized solution source MOCVD

Oxidizing gas: oxygen gas (flow rate: approximately 500 ml/min. (normal condition))

Pressure in chamber: 266 Pa

Figure 3C:
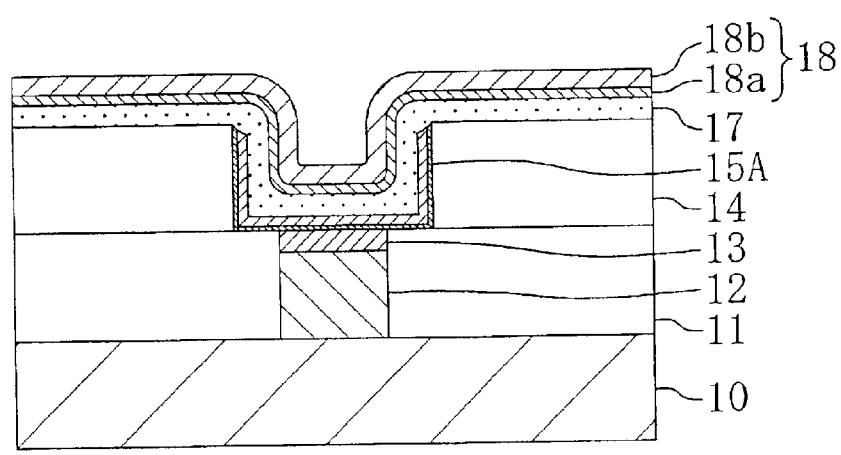

Subsequently, as shown in FIG. 3C, a second lower platinum film 18a is formed by the sputtering on the walls and the bottom of the recess of the BST film 17 and over the BST film 17 in a thickness of, for example, approximately 0.5 through 5 nm. Thereafter, a second upper platinum film 18b is formed on the second lower platinum film 18a in a thickness of, for example, approximately 50 nm by the CVD carried out in an oxidizing gas atmosphere. Thus, a second platinum film 18 is formed from a multi-layer film composed of the second lower platinum film 18a and the second upper platinum film 18b.

The second lower platinum film 18a is formed under the same conditions as those for the first lower platinum film 15a and the second upper platinum film 18b is formed under the same conditions as those for the first upper platinum film 15b, whereas the second lower platinum film 18a is preferably formed with comparatively low energy for avoiding damaging the BST film 17.

If the second upper platinum film 18b is formed in a reducing atmosphere, the BST film 17 is degraded. However, since the second upper platinum film 18b is formed in an oxidizing gas atmosphere in this embodiment, there is no fear of degradation of the BST film 17. Also, since the second upper platinum film 18b is formed in an oxidizing gas atmosphere, the self-catalytic effect is suppressed, so that the second upper platinum film 18b can be formed in a uniform thickness.

Figure 4A:
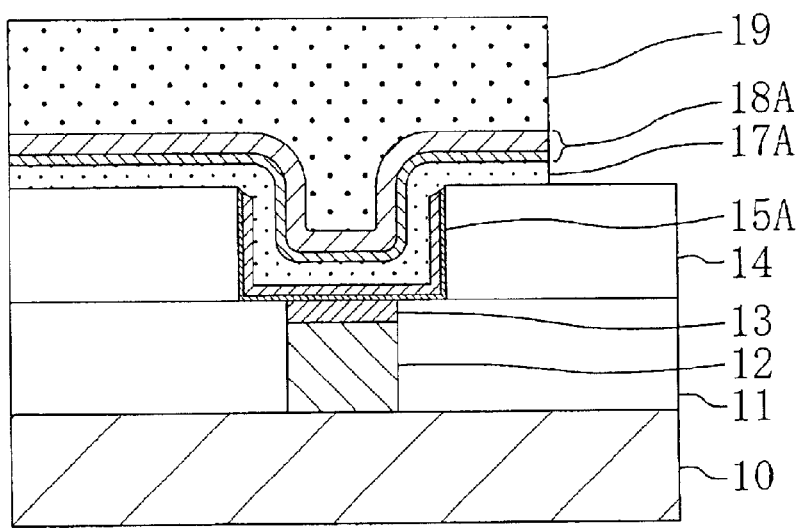
FIGS. 4A and 4B are cross-sectional views for showing still other procedures in the method for fabricating a semiconductor device of Embodiment 1.

Next, as shown in FIG. 4A, a resist pattern 19 is formed on the second platinum film 18, and the second platinum film 18 and the BST film 17 are successively dry etched by using the resist pattern 19 as a mask. Thus, an upper electrode 18A is formed from the second platinum film 18, and a capacitor dielectric film 17A is formed from the BST film 17. In the etching of the second platinum film 18, a mixed gas of an argon gas, a chlorine gas and an oxygen gas can be used as the etching gas.

Figure 4B:
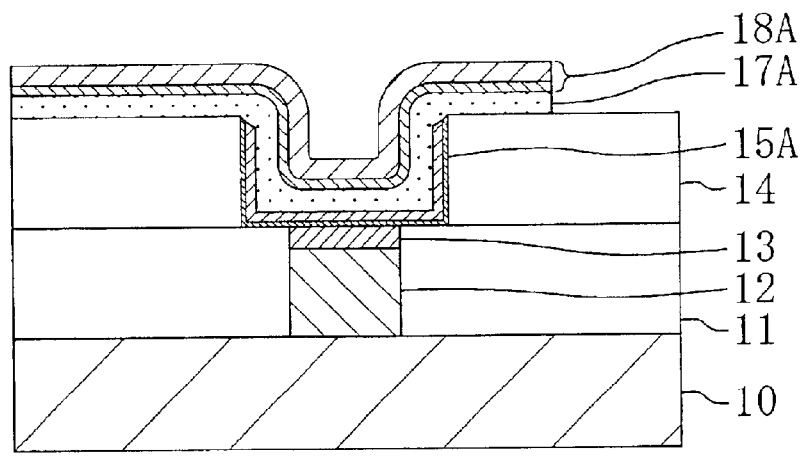

Then, as shown in FIG. 4B, the resist pattern 19 is removed. Thus, a capacitor device composed of the lower electrode 15A, the capacitor dielectric film 17A and the upper electrode 18A can be formed on the plug 12 and the barrier layer 13.

According to Embodiment 1, since the first lower platinum film 15a included in the first platinum film 15 serving as the lower electrode 15A is formed by the sputtering, the morphology of the first platinum film 15 can be improved, so as to improve the quality of the BST film 17 serving as the capacitor dielectric film 17A. Also, since the first upper platinum film 15b disposed on the first lower platinum film 15a is formed by the CVD, the first platinum film 15 can be formed in a uniform thickness. Therefore, although the lower electrode 15A is formed in a small recess with a shorter side of approximately 0.15 $\mu$m and a longer side of approximately 0.3 $\mu$m, the first platinum film 15 serving as the lower electrode 15A is minimally agglomerated during annealing for forming the BST film 17. As a result, the lower electrode 15A can be prevented from being disconnected at the bottom corners.

Furthermore, according to Embodiment 1, since the second lower platinum film 18a included in the second platinum film 18 serving as the upper electrode 18A is formed by the sputtering, an organic substance such as carbon generated from the BST film 17 and the material gas can be prevented from being caught in the second lower platinum film 18a. Therefore, the degradation of the electric characteristic on the interface between the capacitor dielectric film 17A and the upper electrode 18A can be avoided. Also, since the second upper platinum film 18b disposed on the second lower platinum film 18a is formed by the CVD, the second platinum film 18 can be formed in a uniform thickness. Therefore, the second platinum film 18 serving as the upper electrode 18A is minimally agglomerated during annealing for improving the electric characteristic of the BST film 17. As a result, the upper electrode 18A can be prevented from being disconnected at the bottom corners.

In Embodiment 1, the thicknesses of the first lower platinum film 15a included in the first platinum film 15 and the second lower platinum film 18a included in the second platinum film 18 are 0.5 nm or more and 5 nm or less for the following reason: When the first or second lower platinum film 15a or 18a has a thickness smaller than 0.5 nm, the continuity of the first or second lower platinum film 15a or 18a cannot be kept. When the first or second lower platinum film 15a or 18a has a thickness larger than 5 nm, the aforementioned conventional problems cannot be solved, and the first or second lower platinum film 15a or 18a formed by the CVD is degraded in the thickness uniformity. Accordingly, the first and second lower platinum films 15a and 18a preferably have a thickness of 0.5 nm through 5 nm.

Embodiment 2

A method for fabricating a semiconductor device including a stacked capacitor device will now be described as Embodiment 2 of the invention with reference to FIGS. 5A through 5C, 6A and 6B.

Figure 5A:
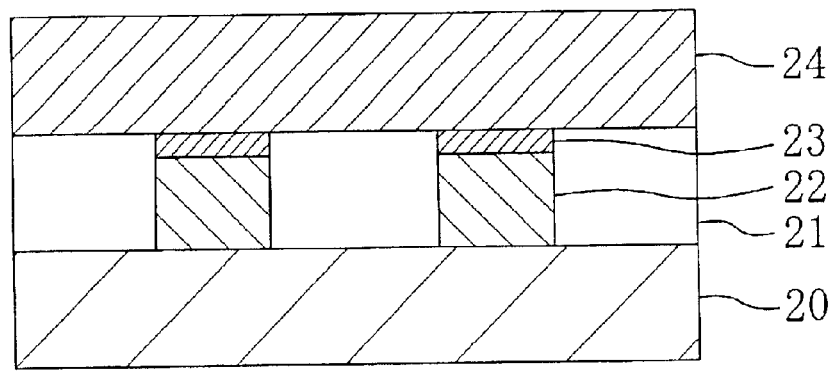
FIGS. 5A, 5B and 5C are cross-sectional views for showing procedures in a method for fabricating a semiconductor device according to Embodiment 2 of the invention.

First, as shown in FIG. 5A, after forming an interlayer insulating film 21 of a silicon oxide film on a semiconductor substrate 20 by, for example, the CVD, plugs 22 and barrier layers 23 are buried to be close to each other in the interlayer insulating film 21. Thereafter, a first platinum film 24 of a platinum film with a thickness of 200 through 300 nm is formed over the barrier layers 23 and the interlayer insulating film 21 by the sputtering.

Figure 5B:
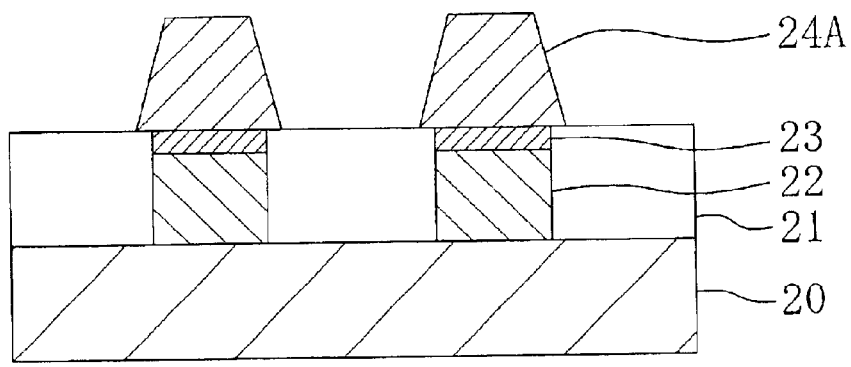

Next, as shown in FIG. 5B, the first platinum film 24 is selectively etched, so as to form lower electrodes 24A from the first platinum film 24.

Figure 5C:
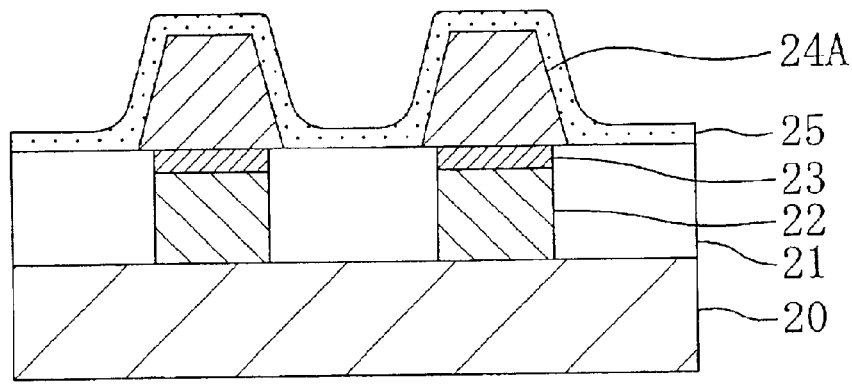

Then, as shown in FIG. 5C, a perovskite type high dielectric constant or ferroelectric film such as a BST film 25 is deposited by the CVD over the lower electrodes 24A and the interlayer insulating film 21. The conditions employed in this case are the same as those described in Embodiment 1.

Figure 6A:
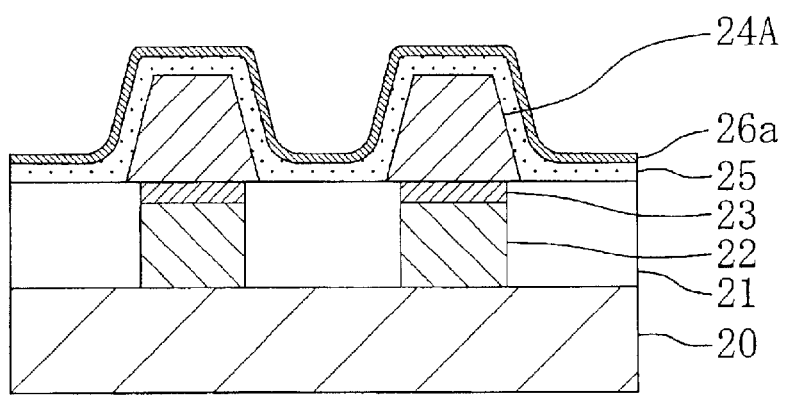
FIGS. 6A and 6B are cross-sectional views for showing other procedures in the method for fabricating a semiconductor device of Embodiment 2.

Subsequently, as shown in FIG. 6A, a lower platinum film 26a is formed by the sputtering in a thickness of, for example, approximately 0.5 through 5 nm on the BST film 25. The conditions for forming the lower platinum film 26a are the same as those for the first lower platinum film 15a and the second lower platinum film 18a of Embodiment 1.

Figure 6B:
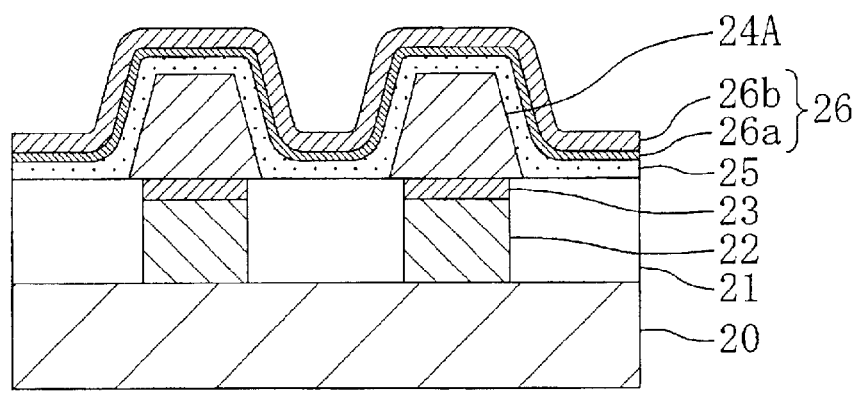
Figure 7A:
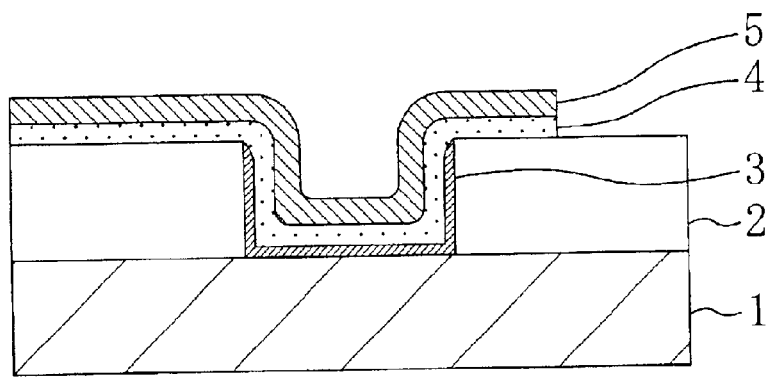
FIG. 7A is a cross-sectional view for showing a conventional method for fabricating a semiconductor device and FIG. 7B is a cross-sectional view for showing problems in the conventional method for fabricating a semiconductor device.
Figure 7B:
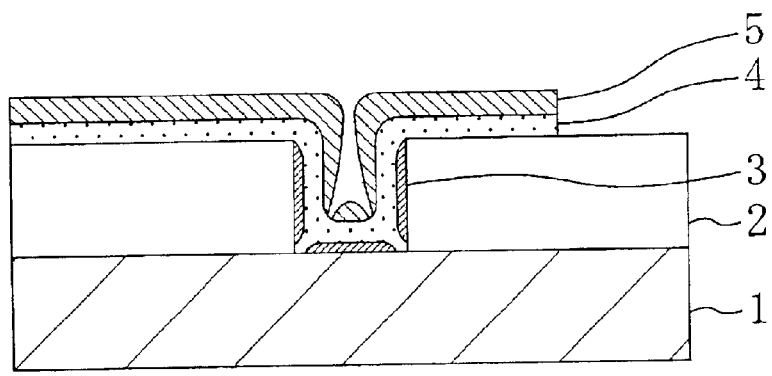

Next, as shown in FIG. 6B, an upper platinum film 26b is formed by the CVD in a thickness of, for example, approximately 50 nm on the lower platinum film 26a, so as to form a second platinum film 26 of a multi-layer film composed of the lower platinum film 26a and the upper platinum film 26b. The conditions for forming the upper platinum film 26b are the same as those for the first upper platinum film 15b and the second upper platinum film 18b of Embodiment 1.

Then, although not shown in the drawing, the second platinum film 26 and the BST film 25 are patterned so as to from upper electrodes from the second platinum film 26 and capacitor dielectric films from the BST film 25.

According to Embodiment 2, since the lower platinum film 26a included in the second platinum film 26 to be formed into the upper electrodes is formed by the sputtering, an organic substance such as carbon generated from the BST film 25 and the material gas can be prevented from being caught in the lower platinum film 26a. As a result, the degradation of the electric characteristic on the interface between the capacitor dielectric film and the upper electrode can be avoided. Also, since the upper platinum film 26b disposed on the lower platinum film 26a is formed by the CVD, although the second platinum film 26 is formed in a small recess because the adjacent lower electrodes 24A are close to each other, the second platinum film 26 can be formed in a uniform thickness. Therefore, the second platinum film 26 to be formed into the upper electrodes is minimally agglomerated during annealing for improving the electric characteristic of the BST film 25 to be formed into the capacitor dielectric film. As a result, the upper electrode can be prevented from being disconnected at bottom corners.

The first platinum film and the second platinum film of Embodiment 1 or 2 may be replaced with a noble metal film made from a noble metal such as ruthenium or iridium, an alloy of any of the noble metals or an oxide of any of the noble metals.

Although the capacitor dielectric film is made from a BST film in Embodiments 1 and 2, a perovskite type high dielectric constant or ferroelectric film, such as an SBT (strontium bismuth tantalum) film, a PZT (lead zirconate titanate) film, an ST (strontium titanium oxide) film, a BT (barium titanium oxide) film or BLT (bismuth lanthanum titanium oxide) film may be used instead.

What is claimed is:

1. A method for fabricating a semiconductor device including a capacitor device having a lower electrode, a capacitor dielectric film formed on said lower electrode and an upper electrode formed on said capacitor dielectric film, comprising a step of:

forming a conducting film to be formed into said lower electrode including sub-steps of:
   forming a lower conducting film over a substrate by sputtering; and
   forming an upper conducting film directly on and in contact with said lower conducting film by CVD,
   wherein said lower conducting film has a thickness of 0.5 nm through 5 nm.

2. A method for fabricating a semiconductor device including a capacitor device having a lower electrode, a capacitor dielectric film formed on said lower electrode and an upper electrode formed on said capacitor dielectric film, comprising a step of:

forming a conducting film to be formed into said upper electrode including sub-steps of:
   forming a lower conducting film over said capacitor dielectric film by sputtering; and
   forming an upper conducting film directly on and in contact with said lower conducting film by CVD,
   wherein said lower conducting film has a thickness of 0.5 nm through 5 nm.

3. The method for fabricating a semiconductor device of claim 2, wherein said capacitor device is a concaved capacitor device.

4. The method for fabricating a semiconductor device of claim 2, wherein said capacitor device is a stacked capacitor device.

5. The method for fabricating a semiconductor device of claim 2, wherein the CVD is carried out in an oxidizing atmosphere.

6. The method for fabricating a semiconductor device of claim 1,
   wherein said capacitor device is a concaved capacitor device, and wherein said lower conducting film is formed over an insulating film having a recess formed over said substrate.

7. The method for fabricating a semiconductor device of claim 1,
wherein said capacitor device is made of a perovskite type high dielectric constant or ferroelectric material.

8. The method for fabricating a semiconductor device of claim 2,
wherein said capacitor device is made of a perovskite type high dielectric constant or ferroelectric material.

9. The method for fabricating a semiconductor device of claim 1, wherein said lower conducting film and said upper conducting film are composed of a precious metal or a precious metal alloy.

10. The method for fabricating a semiconductor device of claim 9, wherein said precious metal is platinum.

11. The method for fabricating a semiconductor device of claim 2, wherein said lower conducting film and said upper conducting film are composed of a precious metal or a precious metal alloy.

12. The method for fabricating a semiconductor device of claim 11, wherein said precious metal is platinum.

* * * * *